United States Patent [19]
Storm

[11] Patent Number: 6,103,427
[45] Date of Patent: Aug. 15, 2000

[54] PRESSURE RELIEVING PELLICLE

[75] Inventor: Glenn Edward Storm, Ridgefield, Conn.

[73] Assignee: DuPont Photomasks, Inc., Round Rock, Tex.

[21] Appl. No.: 08/046,470

[22] Filed: Apr. 13, 1993

Related U.S. Application Data

[63] Continuation of application No. 07/702,214, May 17, 1991, abandoned.

[51] Int. Cl.[7] ......................................................... G03F 9/00
[52] U.S. Cl. .................................................... 430/5; 428/14
[58] Field of Search ........................ 430/5, 321; 428/343, 428/422, 500, 14

[56] References Cited

U.S. PATENT DOCUMENTS 4,996,106  2/1991  Nakegawa et al. ...................... 428/343

FOREIGN PATENT DOCUMENTS

| | | |
|---|---|---|
| 2250055 | of 0000 | Japan . |
| 2287355 | of 0000 | Japan . |
| 3-75835 | 4/1998 | Japan . |
| 1-23137 | 7/1998 | Japan . |
| 2036367 | of 0000 | United Kingdom . |

*Primary Examiner*—Steve Rosasco
*Attorney, Agent, or Firm*—Baker Botts L.L.P.

[57] ABSTRACT

A pattern mask pellicle comprising a peripheral frame, a transparent film extending across the top peripheral surface of the frame, and a peripheral gasket adhered to the bottom peripheral surface of the frame, the frame/gasket assembly including at least one tacky, continuous, tortuous path connecting an opening in the interior wall of the assembly with an opening in the exterior wall of the assembly. At least one pellicle is mounted on a pattern mask substrate to protect the pattern area during imaging in the production of integrated circuits.

18 Claims, 2 Drawing Sheets

PRESSURE RELIEVING PELLICLE

This is a continuation of application Ser. No. 07/702,214 filed May 17, 1991, now abandoned.

FIELD OF THE INVENTION

The present invention relates to pellicles that cover pattern masks during the manufacture of integrated circuits.

BACKGROUND OF THE INVENTION

Integrated circuits typically are manufactured in processes that utilize pattern mask imaging. When these processes involve projection printing of the pattern mask images, radiant energy such as ultraviolet light is passed through the apertures of the pattern mask and is focused on a layer of resist that is coated on a substrate wafer. The light forms a pattern in the layer of resist that corresponds to the pattern, and the layer of resist is then developed to expose portions of the substrate to form a photoresist mask. Because the image of the pattern mask is brought into sharp focus on the photoresist layer surface, any contaminating particles present on the surface of the pattern mask are also brought into sharp focus on the surface of the photoresist layer, causing undesirable printing of the contaminating particle images in the resist layer. Printing of contaminating particle images on the photoresist layer often renders the photoresist mask useless, resulting in considerable economic waste.

To reduce the risk of particulate contamination of pattern masks, protective pellicles are generally used to cover the mask. Pattern mask pellicles include a transparent film that extends across one open surface of a frame of a size sufficient to enclose the pattern area of the mask, and a gasket that adheres the other open surface of the frame to the mask substrate. The frame separates the film from the pattern mask by a distance sufficient to keep the images of contaminating particles that are located on the outer surface of the pellicle out of focus, so that the images of the contaminating particles will not be printed with the circuit pattern on the light sensitive layer of resist.

Pellicles can be manufactured essentially particle-free and mounted over the pattern mask. The space over the mask pattern which is bounded by the mask substrate, gasket, frame and film is in excellently sealed condition hermetically. As a result, when the mask is transported by aircraft, transferred to a high altitude or otherwise subjected to a change in external pressure, the pressure difference between the pressure in the space over the mask pattern and the external pressure causes the pellicle film to bulge or become depressed. Such deformation of the film is disadvantageous in that not only the optical path of the assembly is changed, but also, depending on the degree of deformation, the film may come in contact with the surface of the mask or be damaged by contacting the surrounding package.

To avoid pellicle film deformation due to pressure differentials, different methods for pressure equalization have been proposed. Japanese patent publication JA 154061 and JA 22130 disclose a hole or holes straight through the frame to allow air to flow between the space over the pattern mask and the surrounding environment. The vent holes of both references compromise the essentially particle-free state of the space over the pattern mask.

In U.S. Pat. No. 4,833,051, Imamura also discloses vent holes in the pellicle frame. However, Imamura puts a filter in each vent hole. While the filter helps prevent contaminating particles from entering the space over the pattern mask through the vent hole, it also renders production of the pellicle more complex, difficult and expensive.

SUMMARY OF THE INVENTION

The invention is directed to a pattern mask pellicle comprising a peripheral frame; a transparent film extending across the top peripheral surface of the frame; and a peripheral gasket adhered to the bottom peripheral surface of the frame, the frame/gasket assembly including at least one tacky, continuous, tortuous path connecting an opening in the interior wall of the assembly with an opening in the exterior wall of the assembly.

The invention is further directed to a protected pattern mask comprising a transparent substrate having a pattern of opaque and transparent areas; and at least one pellicle mounted on the transparent substrate, said pellicle comprising a transparent film extending across the top peripheral surface of a peripheral frame and covering said pattern, and a peripheral gasket adhered to the substrate and the bottom peripheral surface of the frame, the frame/gasket assembly including at least one tacky, continuous, tortuous path connecting an opening in the interior wall of the assembly with an opening in the exterior wall of the assembly.

Figure 2:
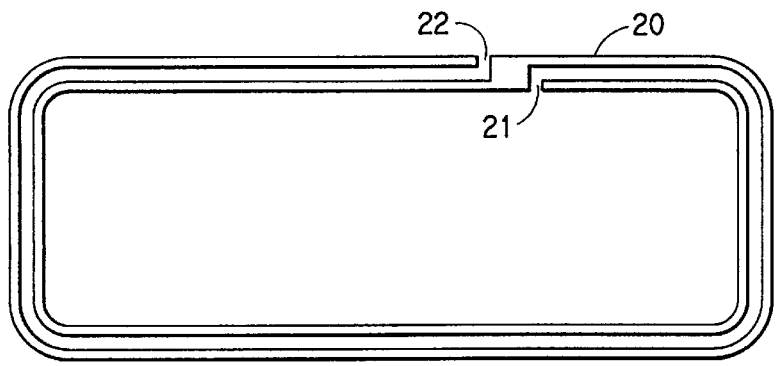
Figure 3:
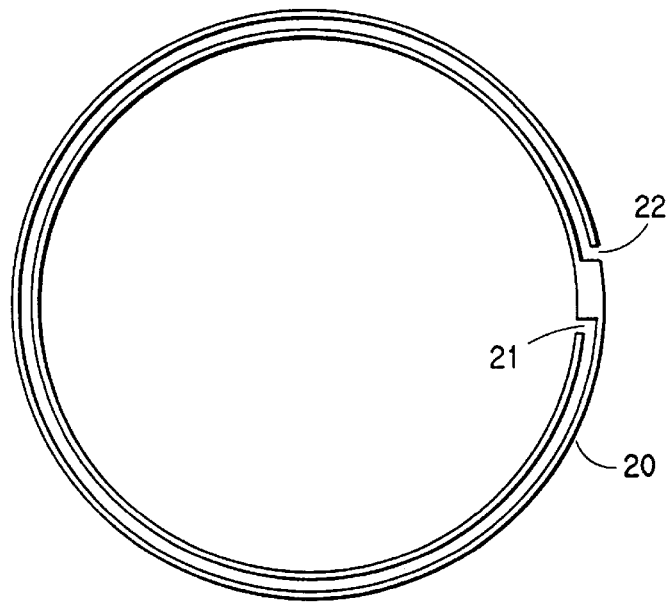
Figure 4:
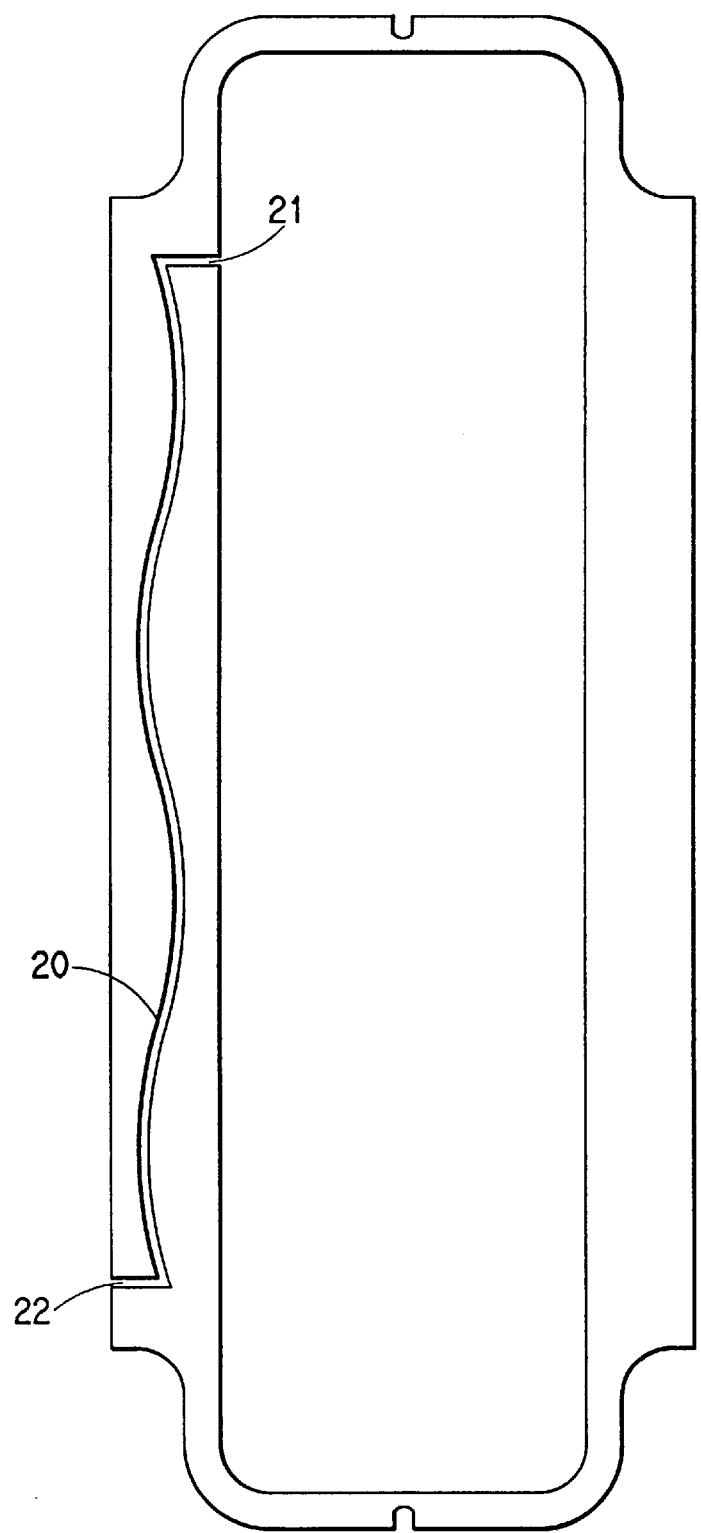

Each of FIGS. 2–4 is a top elevational view of a gasket according to an embodiment of the invention.

DETAILED DESCRIPTION OF THE INVENTION

Figure 1:
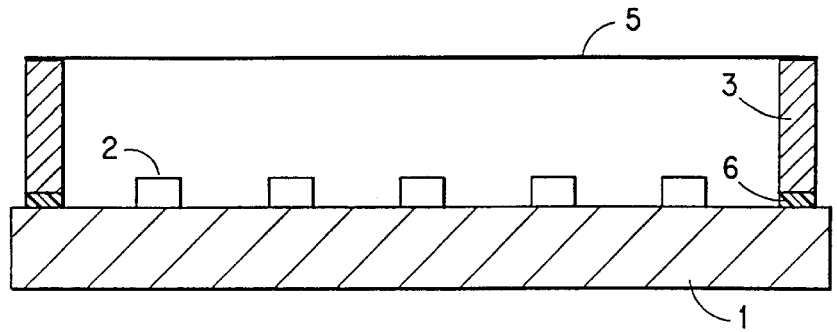
FIG. 1 is a cross-sectional view of a pelliclized pattern mask of the invention.

With reference to FIG. 1, a pellicle includes a transparent film 5 extending across a peripheral frame 3. The frame is formed of any material that has suitably high strength, a low tendency to attract dust and is light weight. Hard plastics, ceramics and metals such as aluminum and aluminum alloys are examples of suitable materials. Machined metals, such as machined aluminum, are preferred.

The shape and size of the frame typically correspond to the pattern mask with which it is to be used. For example, the frame may be circular, angular (e.g. rectangular), have one or more truncated ends, and/or one or more truncated corners.

Transparent film 5 can be formed of any suitable material, and should be of a thickness such that it does not adversely affect the optical path of the image-forming energy. Examples of suitable film materials include polymers such as polycarbonates, polyacrylates, polyvinylbutyrates, polyethersulfones, polysulfones and cellulose derivatives such as cellulose acetate, cellulose acetate butyrate or nitrocellulose, and fluoropolymers.

The film 5 is extended over and attached to the top edge of the peripheral frame 3. Conventional glues and adhesives may be used to attach the film to the frame provided the glue of adhesive does not contain a solvent for the film. Liquid, UV-curable adhesives are suitable. Alternatively, the film may be attached to the frame by heat press lamination.

Peripheral gasket 6 adheres the bottom edge of frame 3 to the mask substrate 1. Generally, the mask substrate comprises a transparent silica glass. Any material which can adhere the frame material and the mask substrate material may be used. For example, adhesive foam, vinyl tapes such as vinyl tape nos. 701 and Y447 (sold commercially by 3M Company, St. Paul, Minn.), and liquids, particularly dispensable anomalous liquids such as silicon rubber or synthetic resins, are useful as gasket 6.

A pellicle comprising film 5, frame 3 and gasket 6 is usually manufactured in a "clean room" facility (i.e. a facility in which ambient particle concentration is measurably reduced) to lessen the particulate contamination. Likewise, a pellicle is typically mounted on a mask substrate 1 over mask pattern 2 in a similar environment. Hence, the space bounded by the pattern mask and the pellicle is essentially particle-free.

At least one tacky, continuous, tortuous path 20 is provided in the frame and gasket assembly of the pellicle of the invention. Each path 20 connects an opening 21 in the interior wall of the frame and gasket assembly with an opening 22 in the exterior wall of the assembly. The course of each path is such that a straight line cannot be drawn from the opening in the interior wall to the opening in the exterior wall without deviating from the path. The path 20 in each of FIGS. 2–4 may be viewed as either a groove in or slot through the gasket or a groove in the bottom edge of the frame. When the gasket forms any part of the path, the path is tacky by virtue of the adhesive of the gasket. When the bottom edge of the frame forms any part of the path, an adhesive such as a spray or liquid adhesive may be applied to the frame.

The groove or slot may be formed by any appropriate method. For example, milling, drilling, etching and laser cutting are suitable. Each path can be formed either before or after the gasket is adhered to the frame, as desired. Also, liquid gaskets that are dispensed onto the frame or substrate may be applied in a pattern that defines a slot through the finished gasket.

The continuous path 20 allows communication between the sealed space which is bounded by the pattern mask, frame, gasket and film, and the exterior space. Such communication enables air passage and, therefore, pressure equalization between the two spaces. Moreover, the path 20 is tacky and tortuous. As the length of the path increases beyond the thickness of the frame (i.e. as the path becomes more tortuous), a particle of any given size is more likely to contact (and adhere) to a side of the path. In this way, pressure is equalized and particle contamination of the mask pattern is prevented.

It is to be understood that the forms of the invention shown and described herein are but preferred embodiments and that various changes may be made to these embodiments without departing from the spirit and scope of the invention.

What is claimed is:

1. A pattern mask pellicle comprising:
   a peripheral frame;
   a transparent film extending across the top peripheral surface of the frame; and
   a peripheral gasket adhered to the bottom peripheral surface of the frame, the frame and gasket assembly including at least one tacky, continuous, tortuous path connecting an opening in the interior wall of the assembly with an opening in the exterior wall of the assembly, said path being free of a porous filter media body.

2. A pattern mask pellicle of claim 1 wherein the path and openings comprise a continuous, tortuous groove or slot in the gasket.

3. A pattern mask pellicle of claim 2 wherein the gasket consists essentially of an adhesive vinyl tape.

4. A pattern mask pellicle of claim 2 wherein the gasket consists essentially of an anomalous liquid.

5. A pattern mask pellicle of claim 1 wherein the path and openings comprise a continuous, tortuous groove in the bottom peripheral surface of the frame.

6. A pattern mask pellicle of claim 5 wherein the gasket consists essentially of an adhesive vinyl tape.

7. A protected pattern mask comprising:
   a transparent substrate having a pattern of opaque and transparent areas and
   at least one pellicle mounted on the transparent substrate, said pellicle comprising a transparent film extending across the top peripheral surface of a peripheral frame and covering said pattern, and a peripheral gasket adhered to the substrate and the bottom peripheral surface of the frame, the frame and gasket assembly including at least one tacky, continuous, tortuous path connecting an opening in the interior wall of the assembly with an opening in the exterior wall of the assembly, said path being free of a porous filter media body.

8. A protected pattern mask of claim 7 wherein two pellicles are mounted on opposite faces of the substrate.

9. A protected pattern mask of claim 7 wherein the path and openings in the frame and gasket assembly comprise a continuous, tortuous groove in the bottom peripheral surface of the frame.

10. A protected pattern mask of claim 7 wherein the path and openings in the frame and gasket assembly comprise a continuous, tortuous groove or slot in the gasket.

11. A protected pattern mask of claim 10 wherein the gasket consists essentially of an adhesive vinyl tape.

12. A protected pattern mask of claim 10 wherein the gasket consists essentially of an anomalous liquid.

13. A pattern mask pellicle comprising:
   a peripheral frame;
   a transparent film extending across the top peripheral surface of the frame; and
   a peripheral gasket adhered to the bottom peripheral surface of the frame and the frame and gasket assembly including a pressure relieving particle contamination means consisting of one tacky, continuous, tortuous path connecting an opening in the interior wall of the assembly with an opening in the exterior wall of the assembly.

14. A pattern mask pellicle of claim 13 wherein the path and openings comprise a continuous, tortuous groove or slot in the gasket.

15. A pattern mask pellicle of claim 14 wherein the gasket consists essentially of an adhesive vinyl tape.

16. A pattern mask pellicle of claim 14 wherein the gasket consists essentially of an anomalous liquid.

17. A pattern mask pellicle of claim 13 wherein the path and openings comprise a continuous tortuous groove in the bottom peripheral surface of the frame.

18. A pattern mask pellicle of claim 17 wherein the gasket consists essentially of an adhesive vinyl tape.

* * * * *